(12) United States Patent
Ye et al.

(10) Patent No.: US 7,295,474 B2
(45) Date of Patent: Nov. 13, 2007

(54) OPERATING AN INFORMATION STORAGE CELL ARRAY

(75) Inventors: Yibin Ye, Portland, OR (US); Muhammad M. Khellah, Tigard, OR (US); Dinesh Somasekhar, Portland, OR (US); Ali Keshavarzi, Portland, OR (US); Fabrice Paillet, Hillsboro, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 25 days.

(21) Appl. No.: 11/172,742

(22) Filed: Jun. 30, 2005

(65) Prior Publication Data

US 2007/0002611 A1    Jan. 4, 2007

(51) Int. Cl.
*G11C 11/34*    (2006.01)
(52) U.S. Cl. ............................ 365/185.24; 365/189.01; 365/189.11; 365/191
(58) Field of Classification Search ........... 365/185.24, 365/189.01, 189.11, 191
See application file for complete search history.

(56) References Cited

U.S. PATENT DOCUMENTS

| 3,983,543 | A | * | 9/1976 | Cordaro ................ 365/205 |
| 4,488,265 | A | * | 12/1984 | Kotecha ................ 365/189.03 |
| 4,610,001 | A | * | 9/1986 | Ong et al. ............ 365/189.01 |
| 4,920,391 | A | * | 4/1990 | Uchida ................ 365/149 |
| 4,935,896 | A | * | 6/1990 | Matsumura et al. ........ 365/187 |
| 5,220,530 | A | * | 6/1993 | Itoh ................ 365/189.01 |
| 5,572,473 | A | * | 11/1996 | Robertson ................ 365/202 |
| 5,701,267 | A | * | 12/1997 | Masuda et al. ............ 365/201 |
| 5,784,320 | A | * | 7/1998 | Johnson ................ 365/189.01 |
| 6,314,017 | B1 | * | 11/2001 | Emori et al. ................ 365/149 |
| 6,831,866 | B1 | * | 12/2004 | Kirihata ................ 365/189.06 |
| 6,954,394 | B2 | * | 10/2005 | Knall et al. ................ 365/211 |
| 7,106,620 | B2 | * | 9/2006 | Chang et al. ................ 365/154 |

FOREIGN PATENT DOCUMENTS

JP    410011980 A    *    1/1998

OTHER PUBLICATIONS

N. Ikeda, et al., "A Novel Logic Compatible Gain Cell With Two Transistors and One Capacitor", ULSI R&D Laboratories, LSI Business & Technology Department Group, C.N.C., Sony Corporation, Japan—2000 Symposium on VLSI Technology Digest of Technical Papers, 0-7803-6305-4, 2000 IEEE (pp. 168-169).

T. Ohsawa, et al., Abstract "Memory Design Using One-Transistor Gain Cell on SOI", Publication Date: 2002, Meeting Date: Feb. 3, 2002-Feb. 7, 2002, San Francisco, CA, USA, ISBN #: 0-7803-7335-9, IEEE *Xplore* Release 2.0 Internet article (1 page).

* cited by examiner

*Primary Examiner*—Viet Q. Nguyen
(74) *Attorney, Agent, or Firm*—Blakely, Sokoloff, Taylor & Zafman LLP

(57) ABSTRACT

A cell in an information storage cell array is written, by asserting a signal on a bit line that is coupled to the cell and to a group of other cells in the array, to a first voltage. The cell is read by asserting a signal on a word line that is coupled to the cell and to another group of cells in the array, in a direction of, but without reaching, the first voltage. Other embodiments are also described and claimed.

11 Claims, 6 Drawing Sheets

OPERATING AN INFORMATION STORAGE CELL ARRAY

BACKGROUND

An embodiment of the invention is directed to an integrated circuit having an information storage cell array, and techniques for reading a cell of the array in a manner that increases a difference in signal voltages from the cell. Other embodiments are also described.

Microelectronic information storage arrays, such as those used in caches and memories, have been expanding in capacity and size to accommodate greater information storage needs. This has led to the development of storage arrays that are denser, that is, have a greater number of cells per unit area of an integrated circuit die. For example, in the field of dynamic random access memories (DRAMs), an array that includes single-transistor gain cells (that amplify a small storage charge) has been proposed. A problem with such an array is that its gain cell, which is made of one or more metal oxide semiconductor (MOS) field effect transistor (FET) devices, exhibits relatively significant leakage from the gate structure of the FET device at a storage node of the cell. As the dimensions of the cell and its constituent transistors decrease, the time interval over which the state of the cell can be retained and read out, without requiring a "refresh", is reduced, due to this leakage. Refresh refers to the periodic referencing of the storage cells in the array, which typically recharges the data-storage nodes of the cell in order to maintain data integrity.

Data integrity may also be improved by adding a "discrete" or non-parasitic capacitor structure to the storage node. This helps reduce the required refresh rate for the array, however, it does make the gain cell larger and therefore reduces the array density. A two-transistor gain cell has been proposed with such a discrete capacitor on the storage node. N. Ikeda, et al. "A Novel Logic Compatible Gain Cell With Two Transistors and One Capacitor", (2000 Symposium on VLSI Technology, pages 168-169, June 2000).

BRIEF DESCRIPTION OF THE DRAWINGS

The embodiments of the invention are illustrated by way of example and not by way of limitation in the figures of the accompanying drawings in which like references indicate similar elements. It should be noted that references to "an" embodiment of the invention in this disclosure are not necessarily to the same embodiment, and they mean at least one.

DETAILED DESCRIPTION

Figure 1:
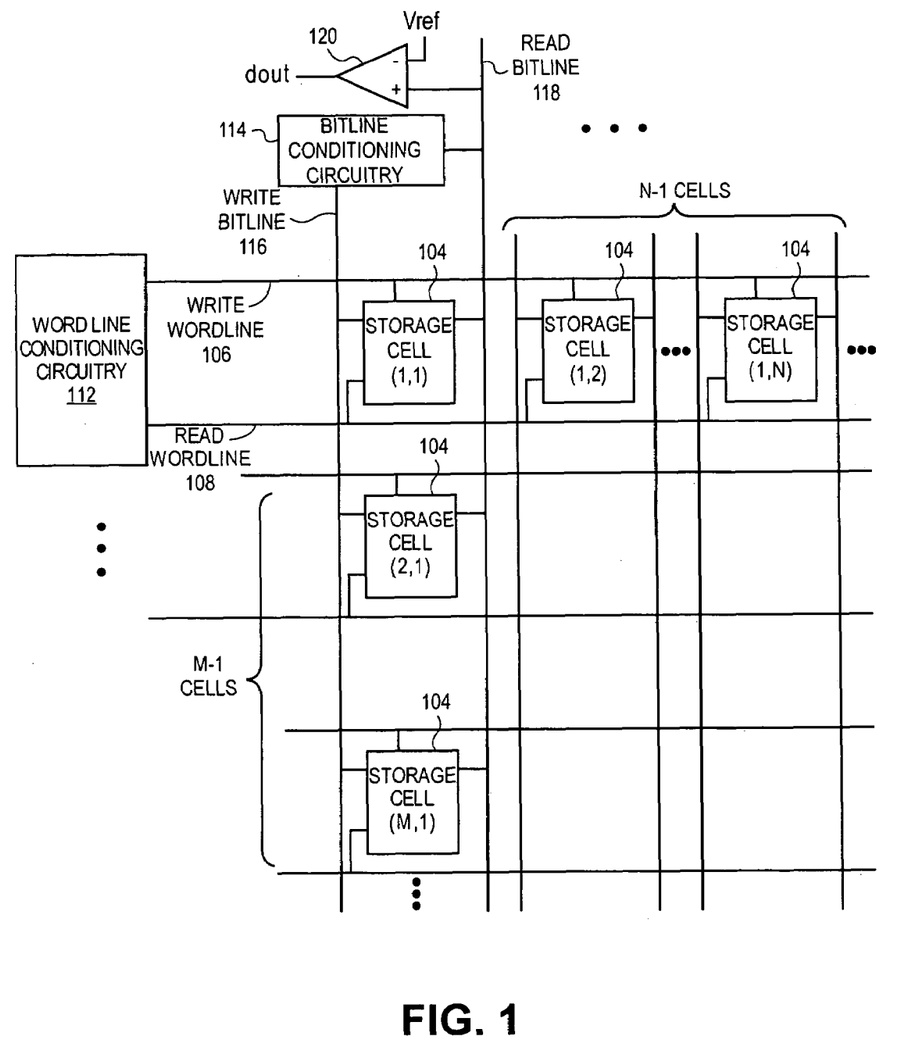
FIG. 1 shows a conceptual block diagram of an information storage cell array having word line and bit line circuitry, according to an embodiment of the invention.

According to an embodiment of the invention, data integrity in a storage cell array may be better maintained, by increasing the sensed voltage differential at the output of the storage cell that represents two different states. This may be achieved, for example, by adjusting an input voltage to the cell, so as to increase a difference in output voltages of two different states. FIG. 1 shows a conceptual block diagram of an information storage cell array having word line and bit line circuitry, according to an embodiment of the invention. This is an example of an array that is two-dimensional, and has storage cells 104 in a rectangular, M×N array. In the example shown, each row of cells 104 in the array is coupled to a respective pair of word lines 106, 108. Word line 106, also referred to as a write word line, conducts current to develop an input voltage to every cell of its row, during a cell write. Similarly, word line 108, also referred to as a read word line, conducts current to develop another input voltage to every cell of its row, during a cell read. The waveforms of the signals that are conducted on these word lines are shaped by the word line conditioning circuitry 112 and may differ depending upon the design of the storage cell 104 (examples of which will be given below).

The array also has bit line conditioning circuitry 114 that is coupled to bit lines 116, 118, and shapes the waveforms on those conductors. The bit lines 116, 118 may be coupled to every storage cell 104 of an associated column of cells. The read bit line 118 is to develop or conduct an output voltage from every cell of its column, during a cell read. The write bit line 116 is to develop or conduct an input voltage to every cell in its column. The conditioning circuitry 112, 114 are designed to source or sink current as needed to develop the required voltages on the word lines or bit lines. Different ways of implementing the circuitry 112, 114 are possible and are within the level of ordinary skill in the art. Some examples, however, will be given below.

In addition to the conditioning circuitry, the array of FIG. 1 also has a separate sense amplifier 120 that is coupled to each read bit line 118, and serves to compare the voltage on the bit line 118 to a reference voltage, Vref. The output of the sense amplifier 120 is then used to determine the current state of a storage cell 104. For example, in the case of a binary cell, the output dout of the amplifier 120 is the current state of the cell.

Figure 2:
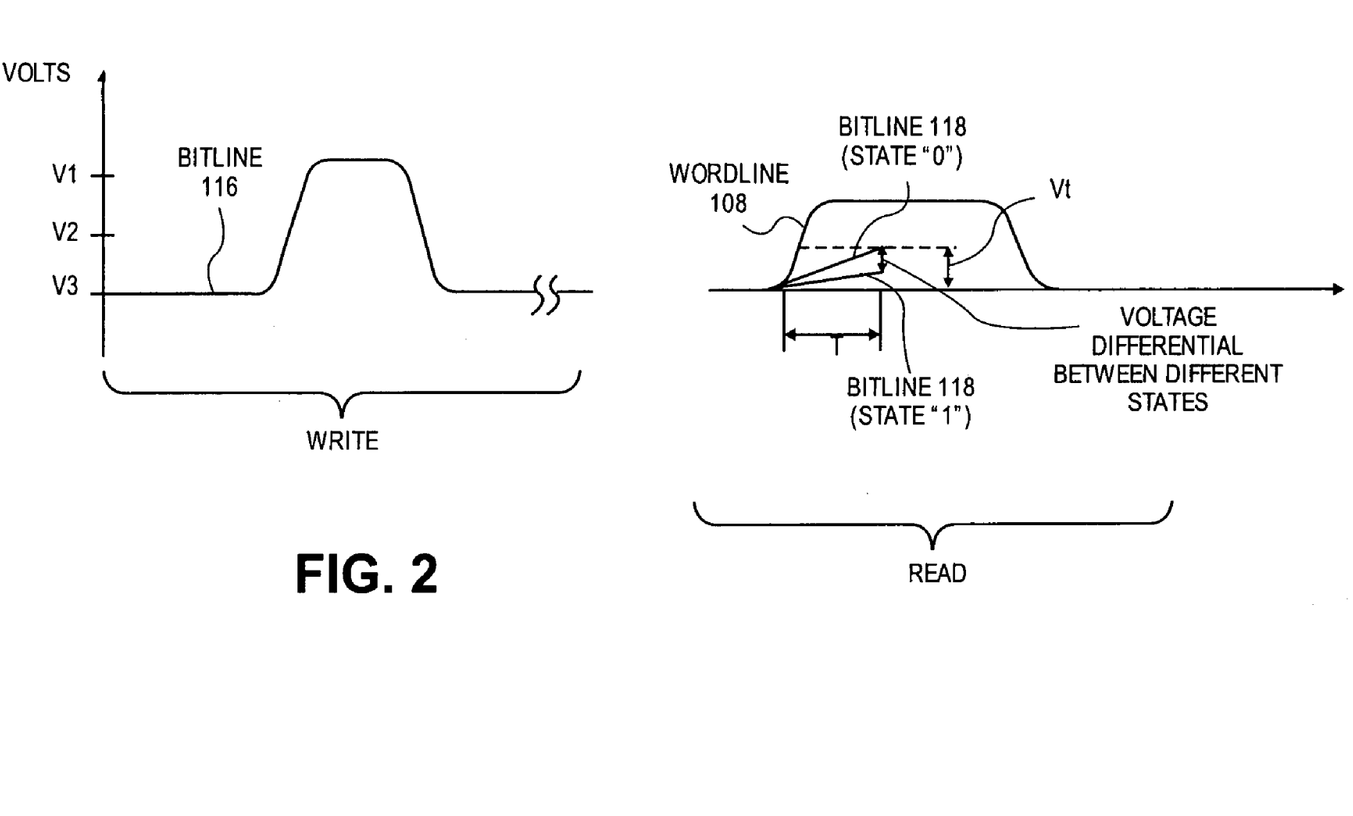
FIG. 2 shows example bit line and word line voltage waveforms for the embodiment of FIG. 1.

A method for operating the storage cell array of FIG. 1, according to an embodiment of the invention, includes the following operations. To write the cell 104 that is at position (1,1), a signal on the write bit line 116 may be asserted to a first voltage V1. Referring now to FIG. 2, the example waveform shows the voltage on bit line 116 is raised from V3 to V1 and stays at V1 for a certain interval before falling back down to V3. Note that the pulse width in this case is substantially greater than the rise time or fall time of the signal.

To read the cell (1,1), a signal on the read word line 108 may be asserted, in a direction of, but without reaching, V1. This is also depicted in FIG. 2, where the voltage for word line 108 is raised from V3 to V2, and remains at V2 for a certain interval before falling back down to V3. Once again, the pulse width is substantially greater than either rise time or the fall time. Processing the read by asserting the word line signal in the manner described, that is preventing it from reaching V1, helps increase the voltage differential at the output of the storage cell, between two different states. In the example of a binary cell, having states "0" and "1", FIG. 2 shows the waveforms for bit line 118 in two different scenarios, one for state "0" (leading to Vbl__0) and the other for state "1" (leading to Vbl__1). By making this differential greater (at the end of the time interval T), it is easier to distinguish between the different states, and therefore data integrity may be improved for the whole array (assuming that the other storage cells in the array exhibit similar behavior).

The above-described method for operating the storage cell array may be implemented in various different scenarios. For example, in the case of a p-channel gain cell array (see FIG. 3 below), V1 may be essentially a power supply voltage of the array (also referred to sometimes as "Vcc" or "Vdd"). In that case, V3 would in most cases be essentially the power return voltage of the array, namely Vss or ground (0 volts) In that case, to write a "1", V1 could be essentially Vcc. To write a "0", V1 would be lower, e.g. essentially V3. Such a cell could be placed in a hold state (to hold its current, programmed or written state), by deasserting the signal on both the read bit line and the read word line 106, to essentially Vss. The new word line voltage V2 may be derived from Vcc on-chip with the array, or it may be generated off-chip.

Figure 7:
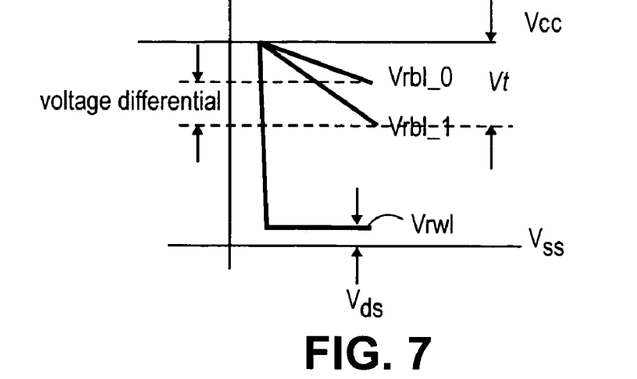
FIG. 7 and FIG. 8 show example voltage waveforms for the embodiment of FIG. 6.
Figure 8:
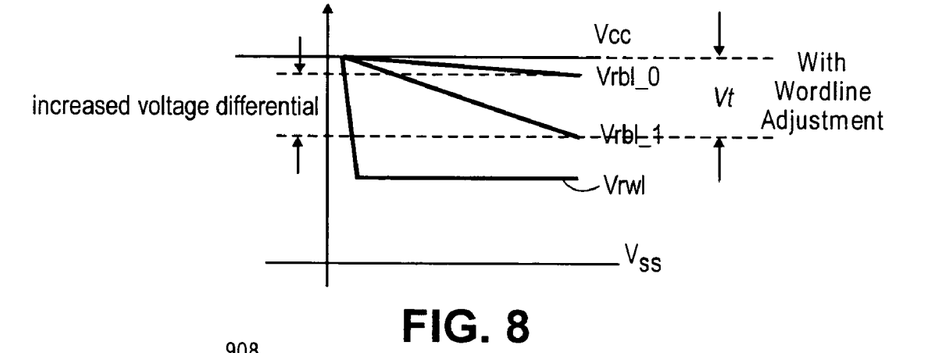

In another embodiment, the above-described method may be implemented in an n-channel gain cell array (see FIGS. 6-8 below). In that case, V1 may be essentially the power return voltage of the array (e.g., equal to Vss+Vds), and the signals on the bit line 116 and word line 118 are asserted in the reverse direction as that shown in FIG. 2.

As explained above, reading the cell, in addition to asserting the signal on the read word line 108, may involve waiting a predetermined time interval T (FIG. 2) after asserting the word line signal, before capturing a voltage on the read bit line 118. This capture would be accomplished using, for example, the sense amplifier 120, and where the reference voltage Vref would be set to approximately one-half the difference between Vbl__0 and Vbl__1.

Also, when asserting the signal on the read word line 108, during the read operation, only one row of the M×N array may need to be selected. That is an embodiment of the invention where the M-1 "unselected" storage cells 104 (FIG. 1) are not capable of resisting the effects of, for example, too large a voltage on the read bit line 118. Those cells might introduce what is referred to here as a distortion current contribution to the signal on the read bit line 118, distorting the read operation for the selected cell (1,1). This effect will be explained further below in connection with the n-channel and p-channel embodiments of FIGS. 3 and 6. To achieve this single row selection, the voltage difference between the read bit line 118 and each of the other read word lines 108 of the array (in this example, those that are coupled to storage cells (2,1), (3,1) . . . (M,1)) should not exceed a threshold voltage Vt of a particular FET in a cell of that group of other cells. In such an embodiment, it can be seen that the voltage differential between states may be increased, but not beyond Vt (as measured with respect to V3). Additional circuitry may be added to the bit line conditioning circuitry 114 and/or the word line conditioning circuitry 112, to limit the total voltage swing on the read bit line 118 (at least during the read operation), to less than Vt. Once again, one of ordinary skill in the art of analog and digital integrated circuit design will be able to specify such additional circuitry, and the different ways of implementing such circuitry as well.

Figure 3:
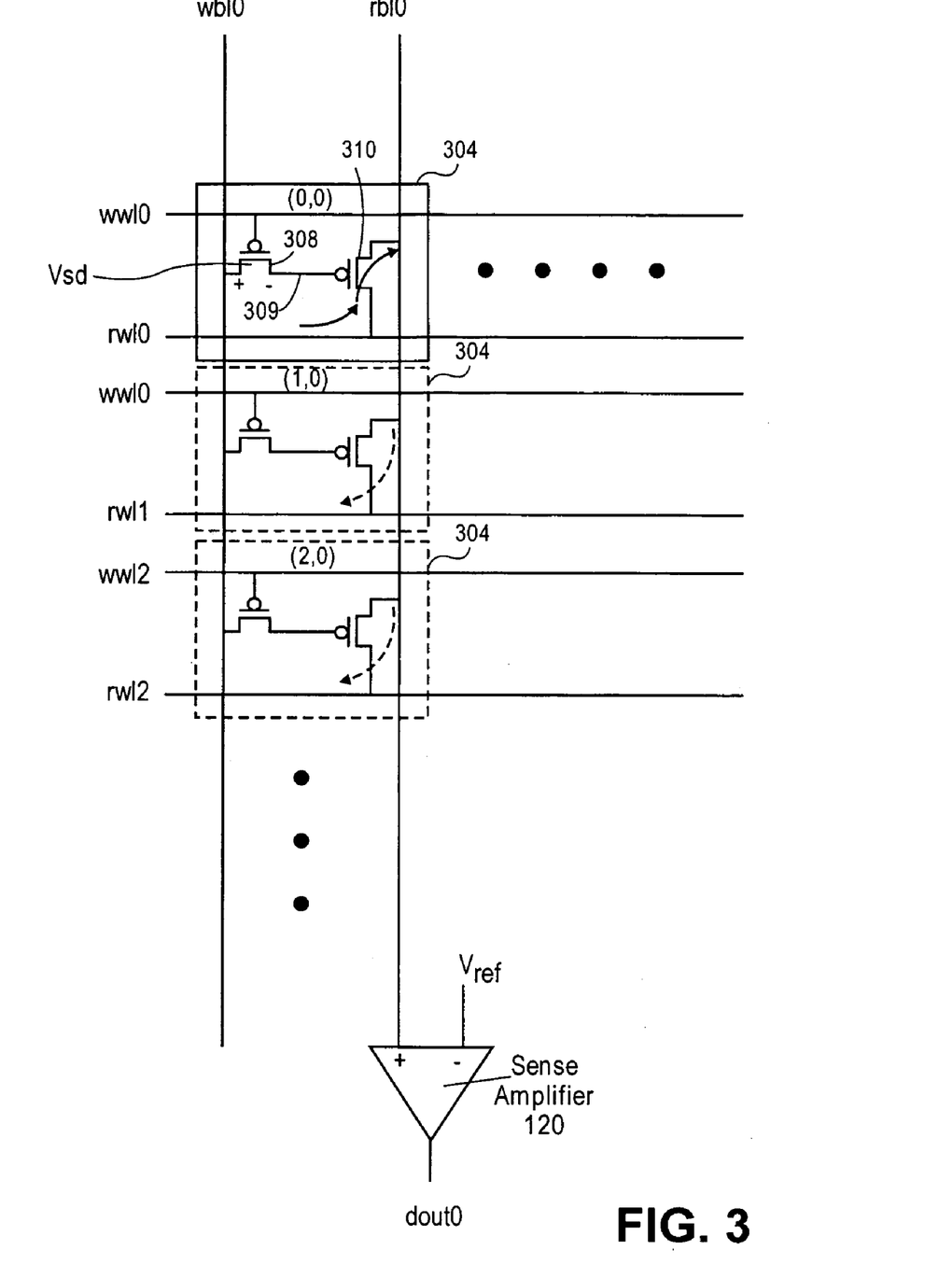
FIG. 3 is a conceptual block diagram of a two-transistor, p-channel gain cell array, according to an embodiment of the invention.

The above-described effect of increased differential between the bit line voltages sensed for different states may be obtained with storage cells of at least two different types. One of these is illustrated in FIG. 3 which shows a conceptual block diagram of a two-transistor, p-channel gain cell array, according to an embodiment of the invention.

Similar to the topology of FIG. 1, each cell 304 is coupled to a respective set of word lines and bit lines. For example, the cell 304 at position (0,0) is coupled to bit lines wbl0 and rbl0, and is coupled to word lines wwl0 and rwl0. The cell 304 is composed of only p-channel MOS field effect transistors 308 and 310, with the gate electrode of transistor 310 being coupled to the drain electrode of transistor 308 as shown, at a storage node 309. With this cell topology, a write occurs when wwl is driven low, so that the transistor 308 (also referred to as the write device) is turned on. To write a logic "0" into the selected cell, wbl is simultaneously driven to a relatively low voltage Vlow, such that Vlow+Vsd, where Vsd is the source-drain drop across transistor 308, is placed on the storage node 309. Vlow may be essentially Vss for the array. On the other hand, a logic "1" may be written into the cell when wbl is driven high (to Vhigh), in which case the storage node will move to Vhigh−Vsd. Vhigh may be essentially equal to or less than Vcc for the array. At the completion of the write, wwl is driven to a high enough voltage with respect to wbl that the write device (transistor 308) is turned off. This isolates the captured charge on the storage node 309. Meanwhile, the transistor 310 (also referred to as the read device) remains off during the entire write operation. This may be achieved by maintaining both rwl and rbl at essentially power supply return voltage, e.g. ground or "zero" volts, plus Vds (the drain-source drop across an n-channel MOS transistor).

Figure 4:
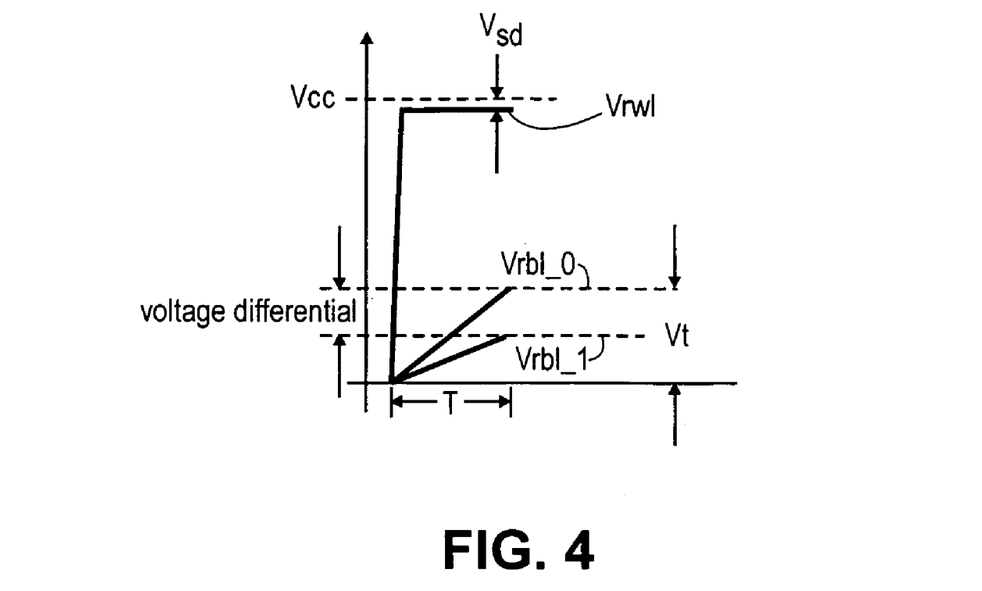
FIG. 4 and FIG. 5 are example voltage waveforms for the read word line and read bit line of the embodiment of FIG. 3.

A read operation begins with rwl, for the selected row only, being pulled to a higher voltage, for example to essentially the power supply voltage. As an example, this high voltage may be Vcc−Vsd, where Vcc is the exact power supply voltage and Vsd is a source-drain voltage drop of a transistor switch that is used to pull up rwl. Pulling up rwl in this case causes the read device (transistor 310) to be turned on, since its gate electrode will be at a lower voltage than rwl. A read current is thus injected into rbl by the read device, and its magnitude depends on the source to gate voltage of the read device, namely Vrwl−Vsn, where Vsn is the voltage on storage node 309. A larger current is drawn from rwl to rbl when a "0" is stored in the cell, because in that case Vsn is at a lower voltage than where a "1" is stored. Accordingly, the voltage at rbl rises faster when a "0" is stored than when a "1" is stored. FIG. 4 illustrates this effect using example waveforms, where the voltage differential between the different states, on rbl, is depicted during a read operation. Since, in this example, the cell is a binary cell in that it can store any one of only two different states, the sense amplifier 120 can detect the current state by simply comparing the voltage on rbl to that of a reference bit line (not shown).

When a cell is not selected to be read or written, it is considered to be in a hold state in which wwl for that cell is maintained at a relatively high voltage related to wbl, and rwl and rbl for the cell may be maintained at essentially the same, relatively low voltage. Wbl may be either at a high or a low voltage. These low and high voltages are selected such that both of the transistors 308, 310 are turned off, and the voltage at the storage node 309 is preserved. Of course, the storage node 309 is subject to leakage, particularly where the gate oxide thickness of the transistor 310 is small, such that the voltage at the storage node 309 begins to gradually collapse toward the power supply return voltage. In most cases, an array of such cells will need a periodic refresh cycle, despite the use of the technique described here for adjusting the word line voltage during read, so as to increase the voltage differential that will be sensed on the read bit line.

Figure 5:
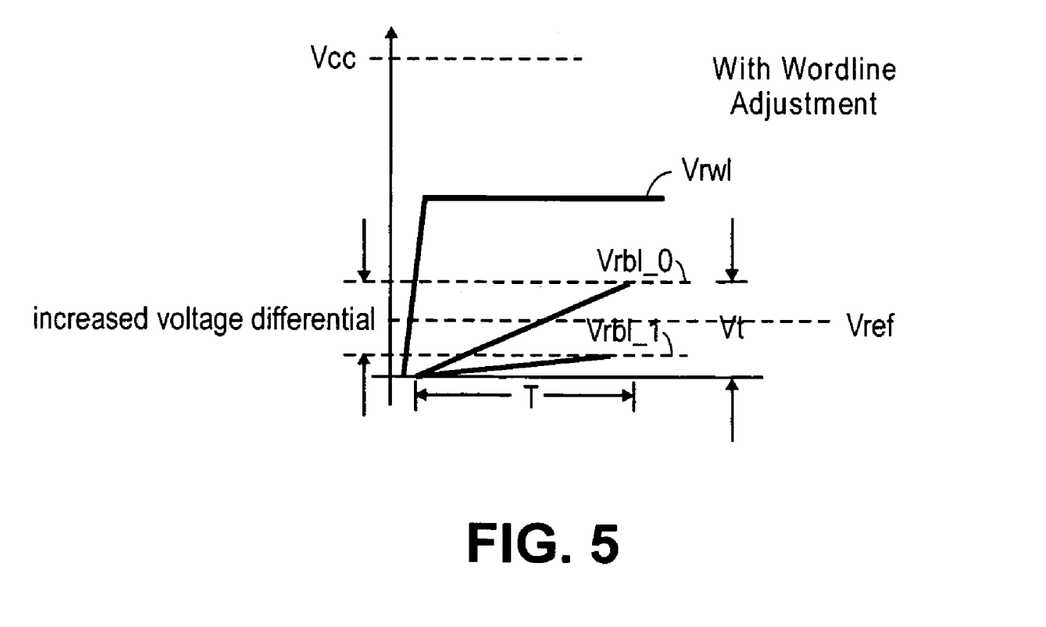

An increased output voltage differential, according to an embodiment of the invention, is depicted in the example waveform of FIG. 5. As seen in FIG. 5, a separate voltage is used for the read word line (rwl), that is substantially lower than Vcc, and in particular by more than 2×Vsd (FIG. 4). Although Vrbl_0 is captured, at the end of the interval T, at about the same voltage as that of FIG. 4 (without the word line adjustment), Vrbl_1 is substantially lower, therefore yielding increased differential. Note, however, that the interval T needed to develop Vrbl_0 and Vrbl_1 is longer, since the current that is drawn into rbl is smaller in the case of FIG. 5 (with word line adjustment).

An explanation for the increased differential on the bit lines may be as follows. The voltage on the bit line for state "1" may be sensed as $$(I1-Iref)*T/Cbit$$

and in the case of the cell storing a "0", the as sensed bit line voltage may be given by $$(Iref-I0)*T/Cbit$$

where Iref is the current created by a dummy storage cell on a reference bit line (not shown), T is the time interval needed to develop the captured bit line voltage (see FIGS. 4 and 5), and Cbit is the effective capacitance of the read bit line. Based on the above, the bit line swing, or voltage differential between states as sensed, may be given by $$Vbl\_diff=(\frac{1}{2})*[(I1-I0)/I0]*Vt$$

Increasing the ratio (I1−I0)/I0 results in a larger Vbl_diff. It has been discovered, in the case of a p-channel array, that reducing Vrwl, that is the voltage on the read word line while its signal is asserted, increases that ratio and therefore increases the differential voltage Vbl_diff.

Figure 6:
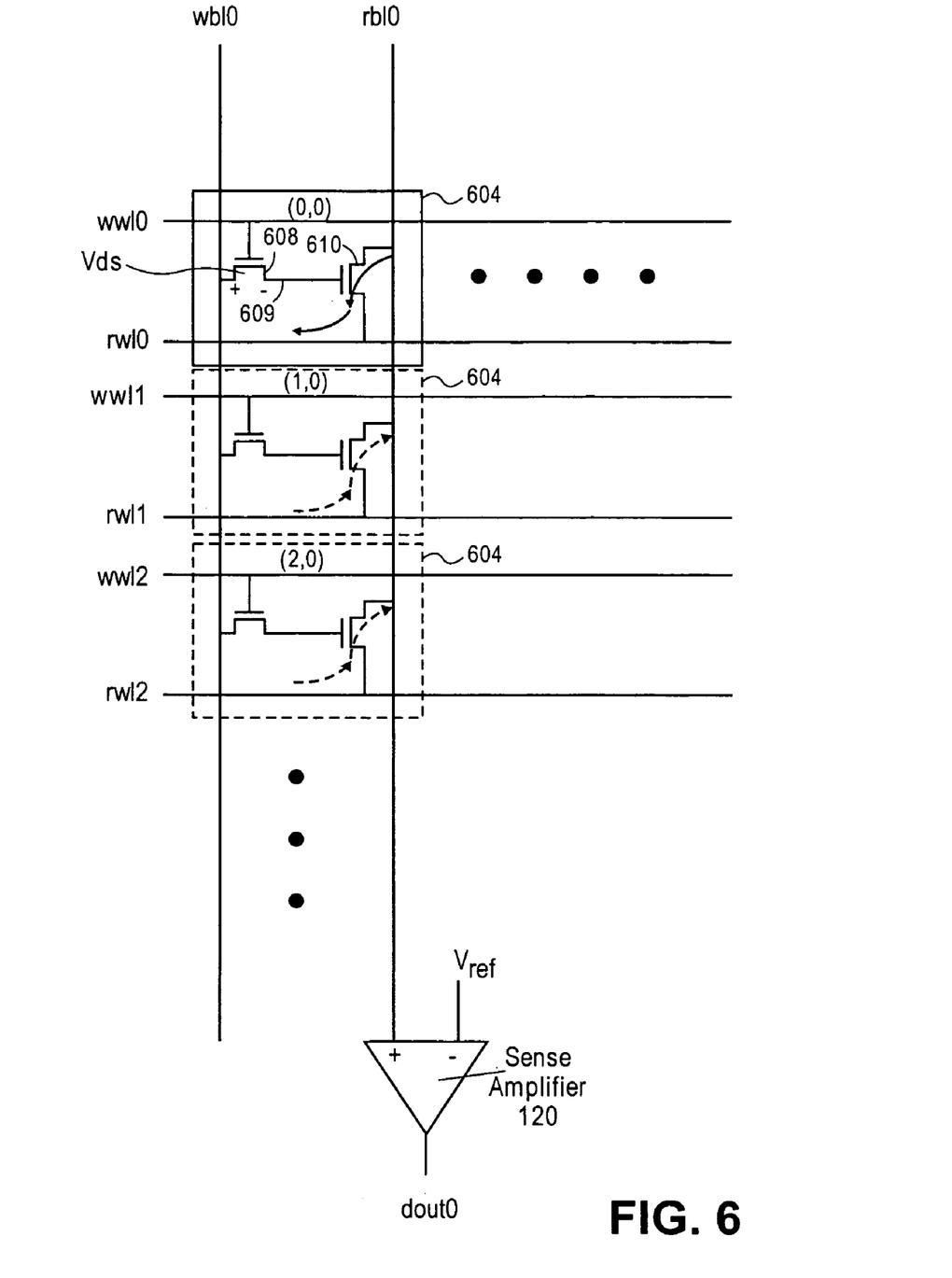
FIG. 6 is a conceptual diagram of a two-transistor n-channel gain cell array, according to an embodiment of the invention.

The word line adjustment methodology described above may also be applied in a substantially similar manner to an n-channel gain cell array as in FIG. 6, except that the signals on the read word line and the read bit line move in a direction reverse of those in FIGS. 4 and 5. FIGS. 7 and 8 show example waveforms for such read word line and read bit line signals of the embodiment of FIG. 6, where FIG. 7 illustrates the situation where no word line adjustment has been applied, while FIG. 8 shows the application of word line adjustment as described above, leading to increased voltage differential between the different states of the cell.

In the n-channel gain cell array of FIG. 6, each cell 604 is composed of only a transistor 608 (write device) and a transistor 610 (read device). Both are n-channel MOS FETs. The source of the transistor 608 is coupled to the gate of transistor 610. Note that in this case, the current that is introduced on the bit line during a read is "negative" in terms of direction, to that of the p-channel array. The unselected cells 604 at positions (1,0) and (2,0) are shown in dotted lines, where once again it is desirable that the distortion current shown in dotted lines that may be introduced by the write devices of these unselected cells is kept to a minimum during the read operation. This may be achieved by, for example, limiting the downward swing on rbl to no more than Vt below the highest possible voltage at the storage node 609 (here, essentially Vcc), at least during the read operation.

Figure 9:
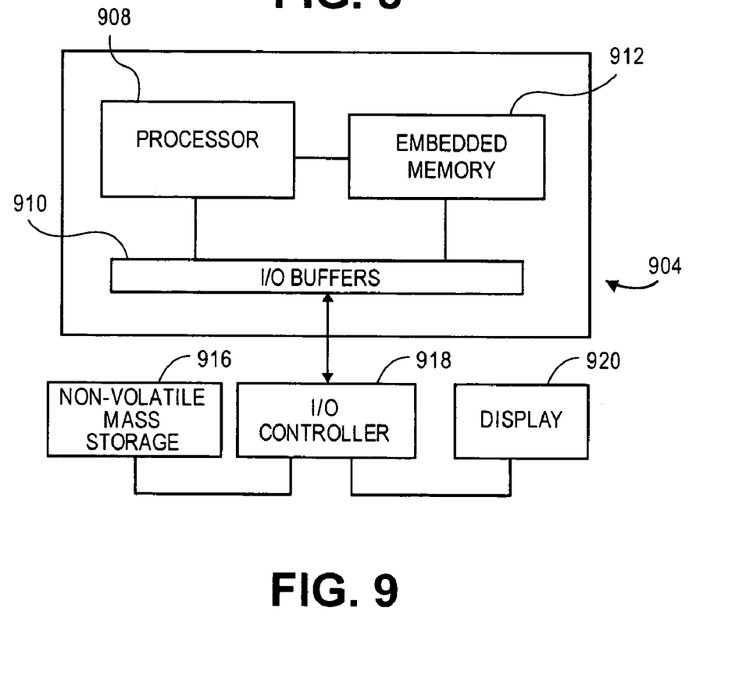
FIG. 9 is a conceptual block diagram of a system with an integrated circuit microprocessor device having embedded memory containing a storage cell array, according to an embodiment of the invention.

Turning now to FIG. 9, a conceptual block diagram of a system with an integrated circuit (IC) microprocessor device 904 having embedded memory 912 containing a storage cell array according to an embodiment of the invention is shown. The device 904 is an example of a logic integrated circuit device that is typically manufactured using a logic fabrication process, rather than one that is designed primarily for stand alone solid state memory devices (e.g., DRAM). The IC device 904 has a processor 908 and embedded memory 912 that is on-chip with the processor. The embedded memory 912 may have an array as described above, including, for example, a two-transistor n-channel or p-channel gain cell array, that is coupled to be accessed by the processor for obtaining stored instructions to be executed by the processor that define an operating system, application program, or firmware. The processor 908 and/or the embedded memory 912 are communicatively coupled to devices external to the IC device 904, by way of on-chip I/O buffers 910. Note that as an alternative to a microprocessor, another type of logic IC device may be fitted with the embedded memory 912, including, for example, an application specific integrated circuit. Yet another application of the storage cell arrays described above may be in stand alone, DRAM devices.

The system also has an I/O controller 918 that may be part of a system interface chipset. The I/O controller 918 translates commands from the processor to, for example, store a file, into lower level commands suitable to control one or more devices that makeup a non-volatile, mass storage 916. The I/O controller 918 may also support a graphics adapter function, to provide the needed control information to a display device 920. Other system embodiments of the storage cell array are possible.

The invention is not limited to the specific embodiments described above. For example, although the storage cells shown in the embodiments of FIGS. 3 and 6 have no discrete, shunt capacitor between the read and write devices, the word line adjustment mechanism described above may also be applied to cell arrays in which such capacitors, e.g. MOS capacitors, are connected to the storage node to further help with data integrity. In addition, the mechanism for comparing the voltage on a read bit line to a reference voltage may be different than the sense amplifier topology shown. For example, the reference voltage may be derived other than through the use of a dummy cell on a reference bit line. Also, the voltage assignments of the different states that can be stored by a storage cell may be different. Accordingly, other embodiments are within the scope of the claims.

What is claimed is:

1. An integrated circuit, comprising:
a plurality of write word lines;
a plurality of read word lines;
a write bit line;
a read bit line;
a plurality of information storage cells, each cell having
a first transistor and a second transistor,
an input electrode of the first transistor in one of the cells being coupled to a respective one of the write word lines, and an output electrode of the first transistor being coupled to the write bit line, an input electrode of the second transistor being coupled to another output electrode of the first transistor, an output electrode of the second transistor being coupled to a respective one of the read word lines, and another output electrode of the second transistor being coupled to the read bit line; and conditioning circuitry to force one of the read word lines towards a power supply or power return voltage of the array, in response to a read command, but stop substantially short of said voltage, wherein the first and second transistors are p-channel field effect transistors, and the conditioning circuitry is to force the read word line towards the power supply voltage and stop more than two transistor source-drain drops below the power supply voltage.

2. The integrated circuit of claim 1 further comprising a sense amplifier having an input coupled to the read bit line and another input coupled to a reference voltage.

3. The integrated circuit of claim 1 further comprising bit line conditioning circuitry to cause a voltage difference between said read bit line and each of the read word lines to not exceed a threshold voltage of the second field effect transistor.

4. The integrated circuit of claim 1 wherein the input electrode of the second transistor is coupled to said another output electrode of the first transistor without any discrete, shunt capacitor between them.

5. An integrated circuit, comprising:
a plurality of write word lines;
a plurality of read word lines;
a write bit line;
a read bit line;
a plurality of information storage cells, each cell having a first transistor and a second transistor,
an input electrode of the first transistor in one of the cells being coupled to a respective one of the write word lines, and an output electrode of the first transistor being coupled to the write bit line, an input electrode of the second transistor being coupled to another output electrode of the first transistor, an output electrode of the second transistor being coupled to a respective one of the read word lines, and another output electrode of the second transistor being coupled to the read bit line; and conditioning circuitry to force one of the read word lines towards a power supply or power return voltage of the array, in response to a read command, but stop substantially short of said voltage, wherein the first and second transistors are n-channel field effect transistors, and the conditioning circuitry is to force the read word line towards the power return voltage and stop more than two transistor drain-source drops above the power return voltage.

6. The integrated circuit of claim 5 further comprising bit line conditioning circuitry to cause a voltage difference between said read bit line and each of the read word lines to not exceed a threshold voltage of the second transistor.

7. The integrated circuit of claim 6 wherein the input electrode of the second transistor is coupled to said another output electrode of the first transistor without any discrete, shunt capacitor between them.

8. A method for operating an information storage cell array, comprising:
writing an n-channel transistor cell in the array by asserting a signal on a bit line that is coupled to the cell and to a group of other cells in the array, to a first voltage; and reading the cell by asserting a signal on a word line that is coupled to the cell and to another group of cells in the array, in a direction of but without reaching the first voltage wherein the signal on the word line is asserted to no lower than two transistor source-drain drops above the first voltage.

9. The method of claim 8 wherein the first voltage is essentially a power return voltage of the array.

10. The method of claim 8 wherein asserting the word line signal causes a voltage to develop on another bit line coupled to the cell,
and wherein reading the cell further comprises comparing the voltage developed on said another bit line with a reference voltage, an outcome of said comparison being a current state of the cell.

11. The method of claim 10 wherein reading the cell selects only one row of the array by causing a voltage difference between said another bit line and each of a plurality of other word lines to not exceed a threshold voltage of a field effect transistor in a cell of said group of other cells.

* * * * *